United States Patent
Ingalls

Patent Number: 5,978,285
Date of Patent: Nov. 2, 1999

[54] VOLTAGE-DEPENDENT DELAY

[75] Inventor: Charles L. Ingalls, Meridian, Id.

[73] Assignee: Micron Technology, Inc., Boise, Id.

[21] Appl. No.: 09/092,392

[22] Filed: Jun. 5, 1998

[51] Int. Cl.$^6$ .................................................. G11C 7/00
[52] U.S. Cl. .................... 365/194; 365/189.09; 365/264; 365/226
[58] Field of Search ..................................... 365/194, 233, 365/226, 148, 100, 189.09, 230.08; 327/264

[56] References Cited

U.S. PATENT DOCUMENTS 5,424,985  6/1995  McClure et al. ......................... 365/194
5,532,969  7/1996  Houghton et al. ....................... 365/226
5,796,284  8/1998  Clemen et al. .......................... 327/264

Primary Examiner—David Nelms
Assistant Examiner—Thong Le
Attorney, Agent, or Firm—Fletcher, Yoder & Van Someren

[57] ABSTRACT

A delay is introduced into the output path of a synchronous device in response to a rising supply voltage. Specifically, as its supply voltage rises, a synchronous memory device may operate too quickly, particularly data output. To slow the rate at which the memory device outputs data, the clock which controls the data output rate is delayed by an amount correlative to the magnitude of the supply voltage.

31 Claims, 7 Drawing Sheets

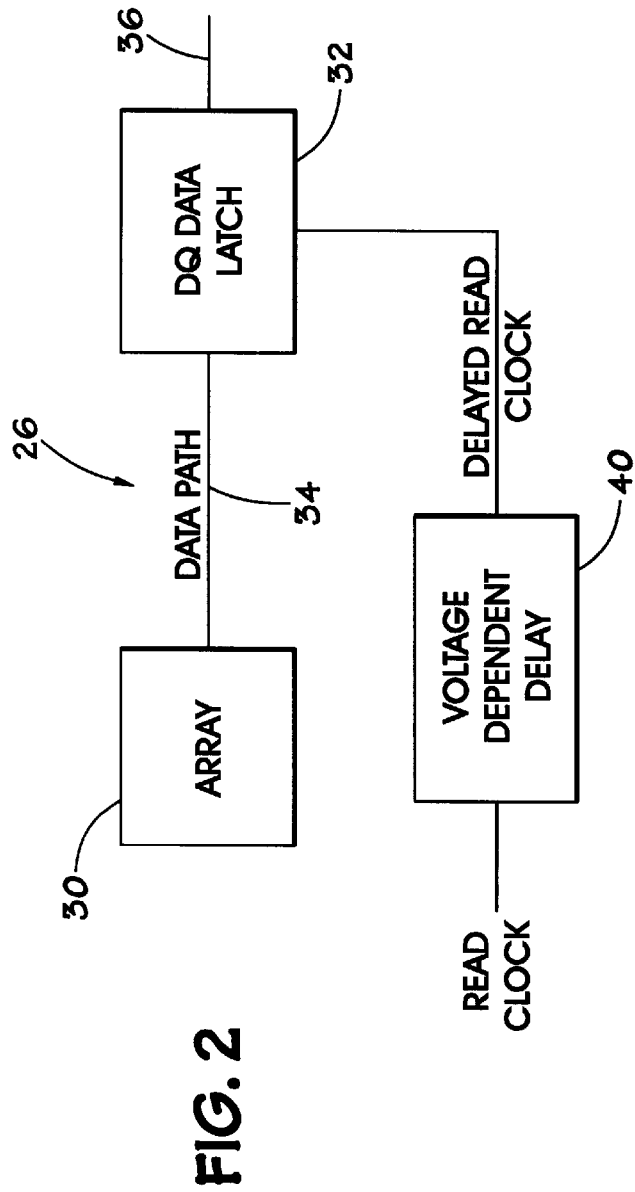
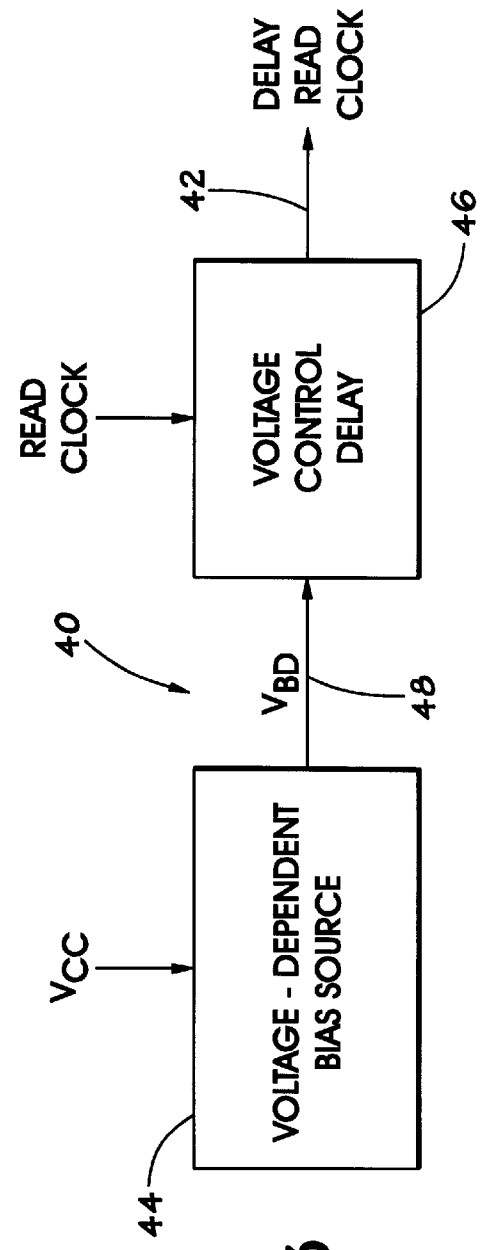
FIG. 2
FIG. 3

VOLTAGE-DEPENDENT DELAY

BACKGROUND OF THE INVENTION

1. Field of the Invention

This invention relates generally to integrated circuits and, more particularly, to a voltage-dependent delay for use in an integrated circuit.

2. Description of the Related Art

Microprocessor-controlled circuits are used in a wide variety of applications. Such applications include personal computers, control systems, telephone networks, and a host of consumer products. As is well known, microprocessors are essentially generic devices that perform specific functions under the control of a software program. This program is stored in a memory device coupled to the microprocessor. Not only does the microprocessor access a memory device to retrieve the program instructions, it also stores and retrieves data created during execution of the program in one or more memory devices.

There are a wide variety of different memory devices available for use in microprocessor-based systems. The type of memory device chosen for a specific function within a microprocessor-based system depends largely upon what features of the memory are best suited to perform the particular function. One common type of memory device is known as a random access memory (RAM). As the name implies, any memory location in a RAM may be accessed individually to store information or to read information. As a further advantage, the memory cells used in most RAMs are capable of handling millions of write, read, and erase cycles, commonly referred to as programming cycles, without failure.

Traditionally, RAMs, such as dynamic RAMs (DRAM) and static RAMs (SRAM), were asynchronous devices. In other words, unlike synchronous devices, such as microprocessors, which perform operations in synchronism with a system clock, traditional asynchronous RAMs perform operations in a sequential manner independent of the frequency at which the associated microprocessor operates. Thus, in a conventional microprocessor-based system, the microprocessor initiates a read cycle or a write cycle with the associated RAM, and the RAM performs the requested operation in an asynchronous manner.

Recently, new microprocessor technology has pushed the operating rates of microprocessors to 200 MHz and beyond. Such fast microprocessors are typically used in general purpose computer systems, such as personal computers and networkable computers, although other applications do exist. At such elevated operating rates, traditional asynchronous memory devices may operate in a less than efficient manner. Accordingly, synchronous memory devices, such as synchronous DRAMs (SDRAM) and synchronous SRAMs (SSRAM), have been developed. Unlike conventional asynchronous memory devices, synchronous RAMs typically operate off of the same system clock used by the microprocessor. Thus, in synchronized systems of this type, the microprocessor is better able to coordinate read and write cycles with the associated memory devices than in systems which use asynchronous memory devices.

While SDRAMs attempt to optimize the data output path to minimize access times, the access time may be variable. For instance, variations in the supply voltage applied to the SDRAM may affect the access time. Specifically, the access time is typically the slowest at low supply voltages and typically the fastest at higher supply voltages. Although faster access times are generally desirable, it should be understood that SDRAMs must hold the output data for a certain time after the next system clock cycle. At high supply voltages, this output data hold time may not be met or it may be marginal. In a situation such as this, it is possible that data from the next data output cycle will overwrite the previous data and, thus, create an error condition.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a device that includes a processor and a memory device coupled to the processor. The memory device includes a memory array coupled to a data output path. The data output path has a data latch which stores data output by the memory array. A delay circuit is coupled to the data latch. The delay circuit receives a clock signal and a supply voltage signal, delays the clock signal by an amount correlative to a magnitude of the supply voltage signal, and delivers a delayed clock signal to the data latch.

In accordance with another aspect of the present invention, there is provided a delay circuit that includes means for generating a bias delay voltage correlative to a supply voltage and means for receiving the bias delay voltage and an input signal and for delaying the input signal by an amount correlative to the bias delay voltage to generate an output signal which is delayed with respect to the input signal.

In accordance with still another aspect of the present invention, there is provided a delay circuit that includes a voltage-dependent bias source being coupled to receive a supply voltage. The voltage-dependent bias source generates a voltage signal having a magnitude correlative to the magnitude of the supply voltage and generates a bias delay signal having a magnitude correlative to the magnitude of the voltage signal. A voltage control delay is coupled to receive the bias delay signal and a clock signal. The voltage control delay generates a delayed clock signal which is delayed by an amount correlative to the magnitude of the bias delay signal.

In accordance with yet another aspect of the present invention, there is provided a delay circuit. A first resistor is coupled to receive a supply voltage. A first transistor is coupled to the resistor at a first node. A voltage reference signal having a magnitude correlative to the magnitude of the supply voltage is generated at the first node. A second transistor is coupled to the first node to receive the voltage reference signal. A second resistor is coupled to the second transistor at a second node. A gain signal having a magnitude correlative to the voltage reference signal is generated at the second node. A first transistor pair is coupled together to form a third node. The first transistor pair is coupled to the second node to receive the gain signal. A bias delay signal having a magnitude correlative to the magnitude of the gain signal is generated at the third node. A second transistor pair is coupled together to form a fourth node. The second transistor pair is coupled to receive a clock signal. A third transistor is coupled to the third node to receive the bias delay signal. The third transistor is coupled to the fourth node. A delayed clock signal having a delay correlative to the magnitude of the bias delay signal is generated at the fourth node.

In accordance with a further aspect of the present invention, there is provided a method of delaying a clock signal that includes the acts of: (a) generating a bias delay voltage correlative to a supply voltage; and (b) delaying the clock signal by an amount correlative to the bias delay voltage to generate a delayed clock signal which is delayed with respect to the clock signal.

In accordance with an even further aspect of the present invention, there is provide a method of operating a memory device that includes the acts of: (a) transferring data from a memory array to a data latch which holds the data; (b) monitoring a supply voltage of the memory device; (c) producing a delay signal in response to the magnitude of the supply voltage rising above a threshold; and (d) using the delay signal to cause the data latch to hold the data for a longer period of time.

BRIEF DESCRIPTION OF THE DRAWINGS

The foregoing and other advantages of the invention will become apparent upon reading the following detailed description and upon reference to the drawings in which:

FIG. 2 illustrates a block diagram of a portion of a synchronous memory device having a voltage-dependent delay in accordance with the present invention;

FIG. 3 illustrates a block diagram of a voltage-dependent delay;

DESCRIPTION OF SPECIFIC EMBODIMENTS

Figure 1:
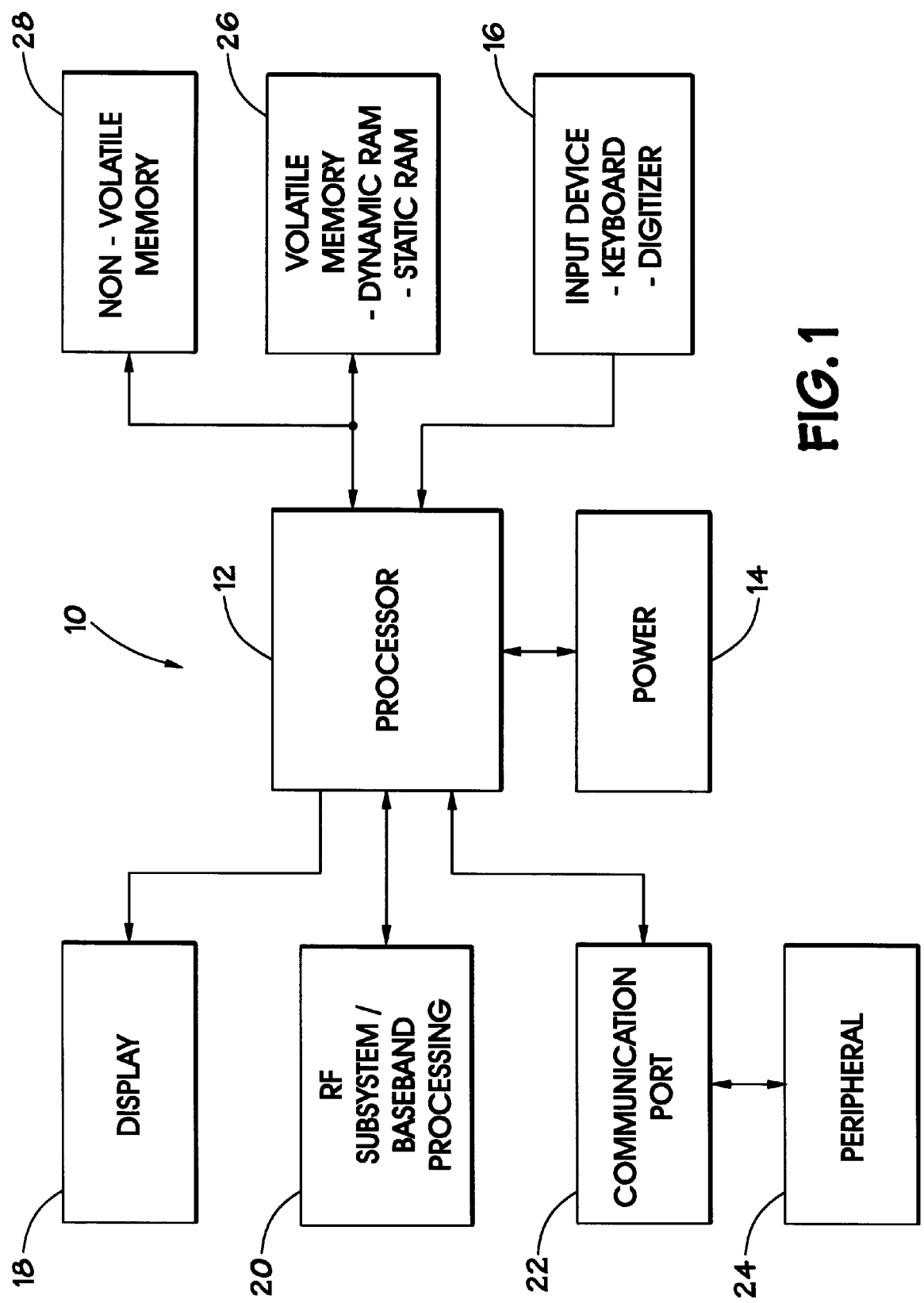
FIG. 1 illustrates a block diagram of an exemplary processor-based device.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The nonvolatile memory 28 may include a read only memory (ROM), such as an EPROM, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

As is clear from the above discussion, a processor-based device 10 may take many forms. Generally speaking, any processor-based device operates in a more efficient manner when it is able to operate faster. At the elevated rates at which current microprocessors are now able to run, a processor-based system 10 may operate in a faster and more efficient manner if the volatile memory 26 includes an SDRAM or an SSRAM. However, care should be taken to ensure that the synchronous RAM does not output data too quickly. For instance, variations in the supply voltage applied to the synchronous RAM may affect the access time. As the supply voltage rises, the synchronous RAM typically operates faster. In fact, at high supply voltages, the synchronous RAM may not be able to hold the output data from the previous read cycle for a sufficient time. Because it is possible that data from the next data output cycle may overwrite the previous data, a delay may be imposed in the data output path at high supply voltages to slow the rate at which the data propagates in an effort to solve this potential problem.

The figures described below illustrate exemplary memory devices that incorporate a voltage-dependent delay which operates to slow down the rate of data propagation in the data output path of the memory device. It should be understood that the basic structure and operation described below is currently believed to be particularly useful on random memories like SSRAMs and SDRAMs, although various synchronous memory devices may benefit from these teachings.

Referring now to FIG. 2, a block diagram of a volatile memory device 26 is illustrated, and it can be assumed for the purposes of this discussion that the volatile memory device 26 is an SDRAM. The memory device 26 includes a memory array 30 which contains memory cells (not shown) that store the data in the memory device. The memory array 30 is coupled to a DQ data latch 32 which is present in the data output path 34. Data to be read from the memory device 26 passes from the memory array 30 along the data output path 34 to the DQ data latch 32. The DQ data latch 32 holds the output data for a certain time until the system can access the data via the output path 36.

It should be appreciated that the DQ data latch 32 must hold the data for some minimum amount of time regardless of the level of the supply voltage $V_{cc}$ which is delivered to the memory device 26. For instance, certain memories must hold the data from the previous cycle a minimum of 3 nanoseconds after the rising edge of the system clock. Typical system specifications for such memories require that the memory be able to operate efficiently and accurately within a given voltage range and within a given temperature range. For example, the memory device 26 may be required to operate efficiently and accurately at a supply voltage $V_{cc}$ between 3.0 volts and 3.6 volts and at a temperature between 0° C. and 70° C.

During the normal operation of the memory device 26, the supply voltage $V_{cc}$ may rise into the upper end of the operating range and, in fact, it may even exceed the upper end of the operating range. As mentioned previously, as the supply voltage $V_{cc}$ rises, the access times of the memory device 26 tend to decrease. As a result, the amount of time that the DQ data latch 32 is able to hold the data may decrease to the point where the minimum hold time is not met or to the point where the minimum hold time is only marginal. Therefore, as illustrated in FIG. 2, a voltage dependent delay 40 may be coupled to the DQ data latch 32 via a line 42. As described in detail below, as the supply voltage $V_{cc}$ rises, the voltage dependent delay 40 tends to slow down the rate at which the data passes from the array 30 to the output path 36 to assure that the data may be accessed efficiently and accurately even during the presence of a high supply voltage $V_{cc}$.

Like the other elements of the memory device 26, the voltage dependent delay 40 receives the supply voltage $V_{cc}$. As illustrated in FIG. 2, the voltage dependent delay 40 also receives the read clock signal. In a conventional memory device, the read clock signal would be routed directly to the DQ data latch 32. However, as the supply voltage $V_{cc}$ rises, the read clock tends to become faster, i.e., its frequency increases. Thus, in this embodiment, the voltage dependent delay 40 acts to reduce the frequency of the read clock and to output a delayed read clock to the DQ data latch 32 via the line 42. Because the delayed read clock is slower, i.e., has a lower frequency, than the read clock at high supply voltages, the DQ data latch 32 operates more slowly and, thus, increases its hold time of the data.

As illustrated in FIG. 3, this embodiment of the voltage dependent delay 40 includes two distinct circuits—a voltage dependent bias source 44 and a voltage control delay 46. The voltage dependent bias source 44 receives the supply voltage $V_{cc}$ and outputs a bias delay signal $V_{BD}$ having a magnitude that is correlative to the magnitude of the supply voltage $V_{cc}$. The voltage control delay 46 receives the bias delay signal $V_{BD}$ on line 48, and it also receives the read clock signal. The magnitude of the bias delay signal $V_{BD}$ influences the rate of the read clock signal in a manner which increases the amount by which the read clock signal is delayed as the supply voltage $V_{cc}$ increases.

Figure 4:
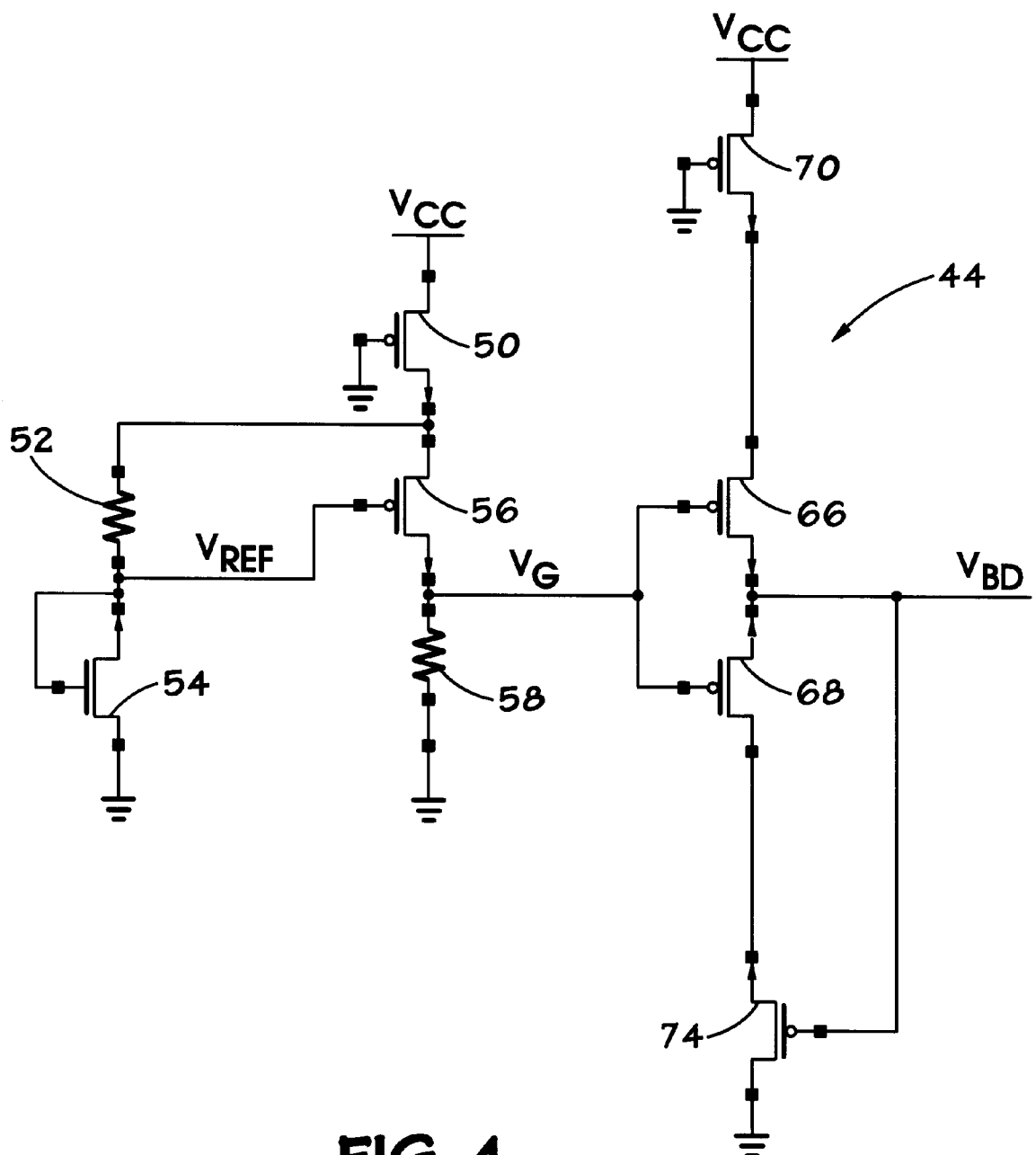
FIG. 4 illustrates a schematic illustration of a basic voltage-dependent bias source.
Figure 5:
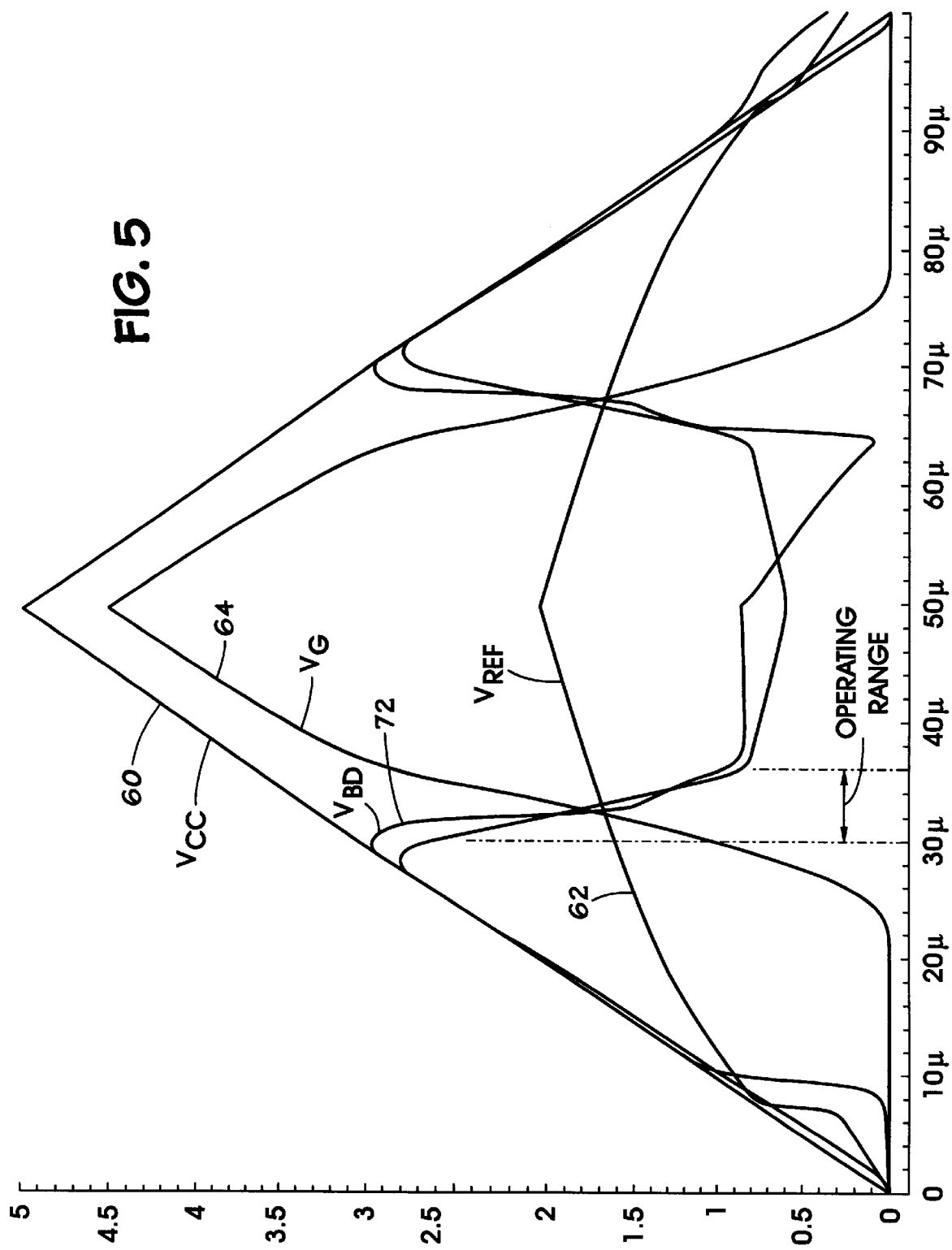
FIG. 5 illustrates various signals related to the voltage-dependent bias source illustrated in FIG. 4.
Figure 6A:
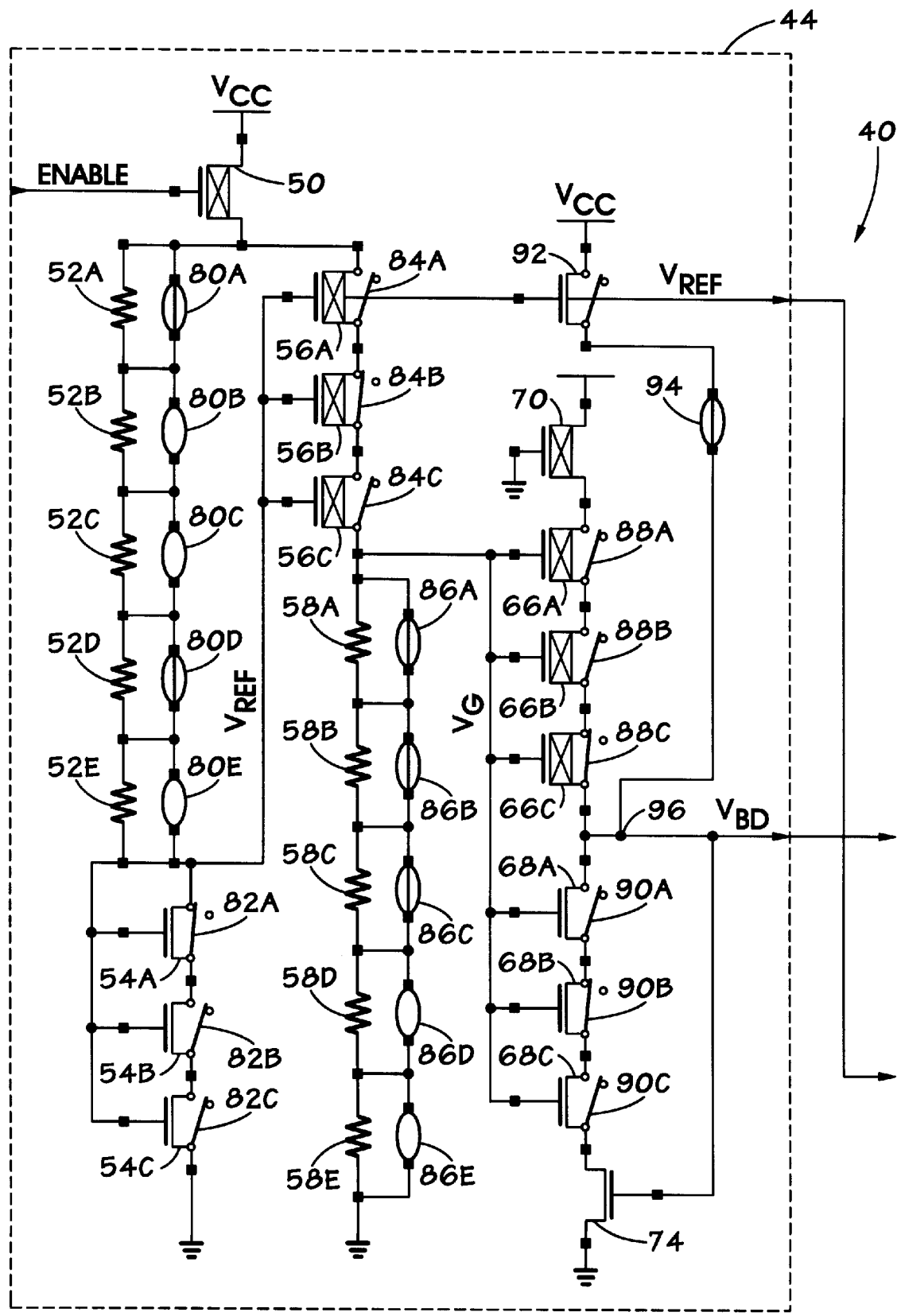
FIG. 6 illustrates a schematic diagram of one embodiment of the voltage-dependent delay.
Figure 6B:
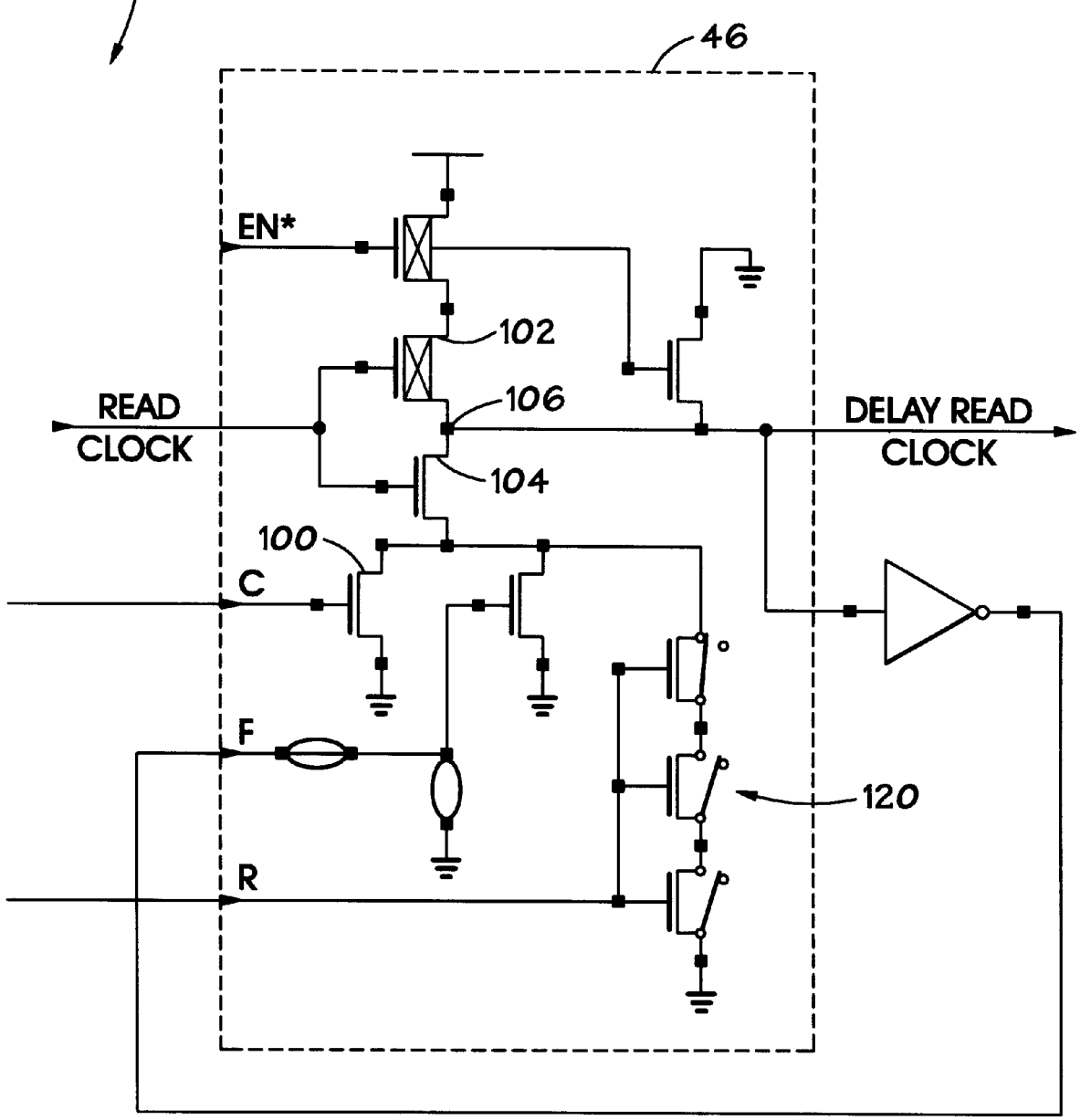

Before discussing a detailed embodiment of the voltage dependent delay 40 illustrated in FIG. 6, it may be useful to gain an understanding of circuit operation by first discussing a basic embodiment of the voltage dependent bias source 44 illustrated in FIG. 4. Various signals that may be present during the operation of the voltage dependent bias source 44 illustrated in FIG. 4 are illustrated in FIG. 5, and these signals will be referred to in conjunction with the operation of the circuit 44 described below. To enable the circuit 44, the gate of the p-channel transistor 50 is tied to ground. With the gate of the transistor 50 tied to ground and with the source of the transistor 50 tied to the supply voltage $V_{cc}$, the transistor 50 turns on. With the transistor 50 on, current flows through the resistor 52 and the diode-connected n-channel transistor 54. Referring to FIG. 5, it can be seen that as the supply voltage $V_{cc}$, illustrated by the curve 60, increases, the reference voltage $V_{ref}$ tends to increase, as illustrated by the curve 62, but at a slower rate due to the voltage drop across the resistor 52.

The reference voltage $V_{ref}$ is coupled to the gate of a p-channel transistor 56. As the reference voltage $V_{ref}$ continues to increase, it acts as a trip point for the transistor 56 and ultimately turns the transistor 56 on. As the transistor 56 turns on, current begins to flow through the transistor 56 and through a resistor 58 which is coupled between the drain of the transistor 56 and ground. A gain signal $V_G$ is generated between the drain of the transistor 56 and the resistor 58. The gain signal $V_G$, represented by the curve 64, is relatively flat until the magnitude of the reference voltage $V_{ref}$ turns on the transistor 56, at which point the voltage of the gain signal $V_G$ begins to rise.

The gain signal $V_G$ is delivered to the gates of a series coupled p-channel transistor 66 and an n-channel transistor 68. As the magnitude of the gain signal $V_G$ increases, the p-channel transistor 66 begins to turn off and the n-channel transistor 68 begins to turn on. Thus, when the supply voltage $V_{cc}$ and the gain signal $V_G$ are low, the p-channel transistor 66 is on and the n-channel transistor 68 is off. Current flows through the enabled p-channel transistor 70, which has its gate tied to ground and its source tied to the supply voltage $V_{cc}$, and current flows through the transistor 66. The bias delay signal $V_{BD}$ essentially tracks the supply voltage $V_{cc}$. However, as the gain signal $V_G$ rises to turn off the p-channel transistor 66 and to turn on the n-channel transistor 68, the magnitude of the bias delay signal $V_{BD}$ begins to drop as illustrated by the curve 72 in FIG. 5.

It should be noted that an n-channel transistor 74 may be provided in a feedback loop between the output node which generates the bias delay signal $V_{BD}$ and the source of the n-channel transistor 68. The feedback transistor 74 begins to turn off as the bias delay signal $V_{bd}$ decreases. Thus, the voltage at the source of the feedback transistor 74 tends to increase to cause the n-channel transistor 68 to begin to shut off, which increases the magnitude of the bias delay signal $V_{BD}$. This range of operation is illustrated by the portion of the curve 72 between approximately 3.6 volts and 5.0 volts.

With the understanding of how the basic voltage dependent bias source 44 of FIG. 4 operates, attention may now be turned to a more specific embodiment of the voltage dependent bias source 44 illustrated in FIG. 6 which operates in essentially the same manner. For purposes of clarity, elements in FIG. 6 that are similar to elements previously discussed in FIG. 4 will be identified by similar reference numerals. As in the previous embodiment, the voltage dependent bias source 44 of FIG. 6 is enabled by a p-channel transistor 50 that has its source coupled to the supply voltage $V_{cc}$. However, unlike the previous embodiment, the gate of the transistor 50 is coupled to receive an enable signal that can selectively turn the voltage dependent bias source 44 on and off. For example, the voltage dependent bias source 44 may be enabled only during the read cycle by the chip enable signal in order to conserve power.

Several resistors 52A, 52B, 52C, 52D, and 52E may be coupled in series with the drain of the transistor 50. It may be advantageous to use several resistors instead of the single resistor 52 so that the resistance value in this leg of the circuit may be tailored based on the desired current to be drawn and the value of the desired reference voltage $V_{ref}$ levels. Therefore, it is advantageous to provide circuitry that is capable of enabling or disabling one or more of the resistors 52A, 52B, 52C, 52D, and 52E. In this embodiment, elements 80A, 80B, 80C, 80D, and 80E are coupled in parallel with each of the resistors 52A, 52B, 52C, 52D, and 52E, respectively. The elements 80A, 80B, 80C, 80D, and 80E may be, for instance, metal mask options that may be selected during fabrication or programmable fuses or antifuses that may be selected after fabrication. In this instance, it can be seen that the elements 80A and 80D form connections which effectively cause the resistors 52A and 52D to be bypassed during the operation of the voltage dependent bias source 44.

It should be noted that transistors may be used in place of the resistors 52A, 52B, 52C, 52D, and 52E. However, although the resistors 52A, 52B, 52C, 52D, and 52E likely occupy more chip area than transistors, it is currently believed that resistors offer certain advantages as compared with transistors. For example, the operation of transistors tends to fluctuate with voltage and temperate changes. In contrast, the resistance value of the resistors 52A, 52B, 52C, 52D, and 52E do not fluctuate with voltage changes. Furthermore, to minimize any resistance fluctuations that may take place due to temperature variations, the resistors 52A, 52B, 52C, 52D, and 52E may be formed as active area resistors.

The resistor 52E is coupled to three n-channel transistors 54A, 54B, and 54C. Like the plurality of resistors discussed above, it may be advantageous to provide several transistors instead of the single transistor 54 in order to be able to select the desired current draw with greater specificity. To facilitate this selection, elements 82A, 82B, and 82C may be coupled across each transistor 54A, 54B, and 54C. Like the elements 80 discussed above, the elements 82A, 82B, and 82C may be, for instance, a mask metal option that may be selected during fabrication or a fuse/antifuse that may be selected after fabrication. In this instance, the transistors 54B and 54C have been selected for operation, while the element 82A provides a short circuit connection to disable the transistor 54A.

As with the circuit illustrated in FIG. 4, a reference voltage $V_{ref}$ is generated at the node which connects the resistors 52 with the transistors 54. The voltage reference signal $V_{ref}$ is delivered to the gates of three p-channel transistors 56A, 56B, and 56C. As with the previously discussed elements in this embodiment, several p-channel transistors 56A, 56B, and 56C are advantageously provided so that the desired current draw may be selected with greater specificity. To facilitate this selection, elements 84A, 84B, and 84C are coupled across each respectively transistor 56A, 56B, and 56C, and these elements may be similar to the elements 80 and 82 discussed previously. In this illustration, the transistors 56A and 56C have been selected for operation, while the element 84B creates a short circuit connection which disables the transistor 56B.

The source of the transistor 56C is coupled to a plurality of serially connected resistors 58A, 58B, 58C, 58D, and 58E. As explained above in regard to the resistors 52, it may be advantageous to provide a plurality of resistors 58A, 58B, 58C, 58D, and 58E so that the resistance value and, thus, the value of the gain signal $V_G$, may be selected in a more precise manner. To facilitate this selection, an element 86A, 86B, 86C, 86D, or 86E is coupled in parallel with each respective resistor 58A, 58B, 58C, 58D, and 58E. Like the previously described elements, the elements 86A, 86B, 86C, 86D, and 86E may be, for instance, a mask metal option that may be programmed during fabrication or a fuse/antifuise that may be programmed after fabrication. In this illustration, the resistors 58D and 58E have been selected for operation, while the elements 86A, 86B, and 86C provide short circuit connections which disable the resistors 58A, 58B, and 58C.

The gain signal $V_G$ that is generated is delivered to the gates of several p-channel transistors 66A, 66B, and 66C, and also to the gates of several n-channel transistors 68A, 68B, and 68C. Several transistors are advantageously placed in the circuit for the reasons discussed above, and a respective element 88A, 88B, 88C, 90A, 90B, and 90C is fabricated to facilitate the selection of one or more of the transistors 66A, 66B, 66C, 68A, 68B, and 68C. These elements are similar to the elements discussed above, and, in this example, the transistors 66A, 66B, 68A, and 68C have been selected for operation, while elements 88C and 90B provide short circuit connections to disable the transistors 66C and 68B.

The voltage dependent bias source 44 illustrated in FIG. 6 incorporates one additional feature that was not described with reference to FIG. 4. An n-channel transistor 92 has its gate coupled to receive the reference voltage $V_{ref}$ and its source coupled to receive the supply voltage $V_{cc}$. The drain of the transistor 92 is coupled to the node 96 where the bias delay signal $V_{BD}$ is generated. Advantageously, this coupling may be enabled or disabled by the use of an element 94, which may be a metal mask option that is selected during fabrication or a fuse/antifuse that is selected after fabrication. The transistor 92 is primarily responsible for keeping the bias delay signal $V_{BD}$ from going too low. As illustrated by the bias delay curve 72 in FIG. 5, as the supply voltage decreases from approximately 5.0 volts to approximately 4.0 volts, the bias delay signal $V_{BD}$ dips from approximately 1.0 volts to approximately 0.2 volts before the gain signal $V_G$ drops to cause the bias delay signal $V_{BD}$ to rise again. However, were it not for the transistor 92, the bias delay signal $V_{BD}$ would reach ground in this situation.

The bias delay signal $V_{BD}$ is delivered to the voltage control delay circuit 46. Specifically, the bias delay signal $V_{BD}$ is delivered to the gate of an n-channel transistor 100. The read clock signal is delivered to the gates of a transistor pair, which includes a p-channel transistor 102 and an n-channel transistor 104. The drain of the transistor 100 is connected to the source of the transistor 104. As the bias delay signal $V_{BD}$ continues to fall as the supply voltage $V_{cc}$ continues to rise from approximately 3.0 volts to approximately 3.6 volts, as illustrated in FIG. 5, the n-channel transistor 100 begins to turn off. This introduces more resistance into the pair of transistors 102 and 104 which receive the read clock signal, which delays the rate at which the read clock signal switches. This delay becomes longer as the supply voltage $V_{cc}$ continues to rise. More specifically, the transistor 100 impedes the signal change in response to changes in the bias delay signal $V_{BD}$. As the bias delay signal changes the impedance of the transistor 100, the discharge rate of the node 106 which, thus, carries a delayed read clock signal. In other words, the discharge rate, in effect, slows the rate at which the read clock signal transitions at the node 106.

Figure 7:
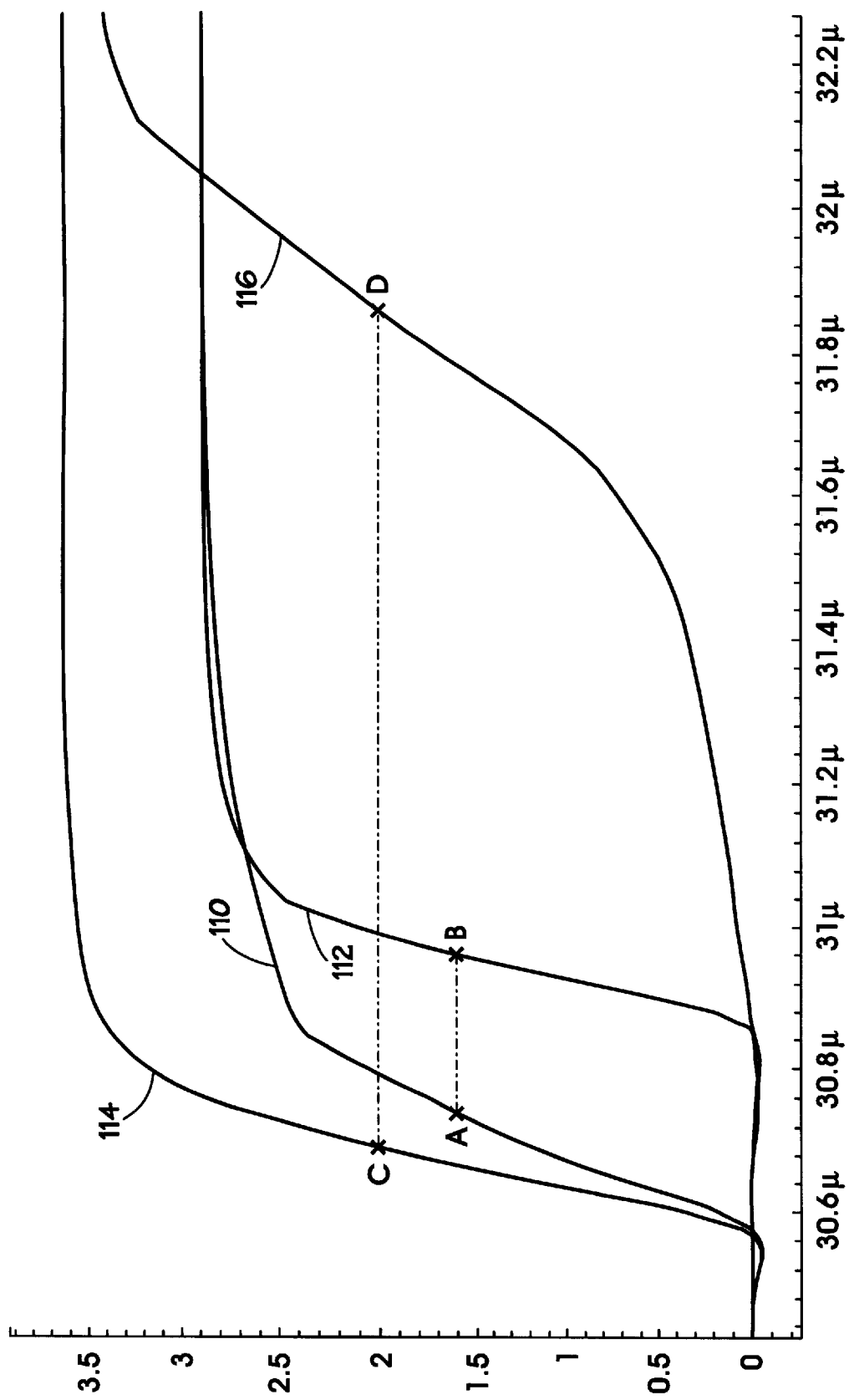
FIG. 7 illustrates various signals related to the voltage-dependent delay illustrated in FIG. 6.

This effect is illustrated in FIG. 7. The curve 110 illustrates the rate at which the read clock signal switches when the supply voltage $V_{cc}$ is 2.9 volts, and the curve 112 illustrates the rate at which the delayed read clock signal switches when the supply voltage $V_{cc}$ is 2.9 volts. Between points A and B on the curves 110 and 112, respectively, it can be seen that the delayed read clock signal 112 is delayed by 228 picoseconds as compared with the read clock signal 110.

In contrast, he curve 114 illustrates the rate at which the read clock signal switches when the supply voltage $V_{cc}$ is 3.7 volts, and the curve 116 illustrates the rate at which the delayed read clock signal switches when the supply voltage $V_{cc}$ is 3.7 volts. Between points C and D on the curves 114 and 116, respectively, it can be seen that the delayed read clock signal 116 is delayed by 1.136 nanoseconds as compared with the read clock signal 114. Therefore, the additional delay added by the voltage control delay circuit 46 as $V_{CC}$ rises from a relatively low voltage, such as 2.9 volts, to a relatively high voltage, such as 3.7 volts, is equal to 908 picoseconds in this example.

Finally, it should be noted that the voltage control delay circuit 46 also includes one or more transistors 120 that may be programmed for operation as described above. The gates of the transistors 120 receive the voltage reference signal $V_{ref}$, and the drain of one of the transistors is coupled to the source of the transistor 104. As the supply voltage $V_{cc}$ continues to rise, so does the reference voltage $V_{ref}$. As this happens, the transistors 120 will begin to limit the amount of delay introduced into the read clock signal so that high supply voltage levels not cause the delayed read clock signal to be delayed by too much.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device comprising:

a processor; and a memory device coupled to the processor, the memory device comprising:
a memory array coupled to a data output path, the data output path having a data latch which stores data output by the memory array; and
a delay circuit coupled to the data latch, the delay circuit receiving a clock signal and a supply voltage signal, the delay circuit delaying the clock signal by an amount correlative to a magnitude of the supply voltage signal, and the delay circuit delivering a delayed clock signal to the data latch.

2. The device, as set forth in claim 1, wherein the delay circuit comprises:

a voltage-dependent bias source being coupled to receive the supply voltage signal, the voltage-dependent bias source generating a bias delay signal having a magnitude correlative to the magnitude of the supply voltage signal; and a voltage control delay being coupled to receive the bias delay signal and the clock signal, the voltage control delay generating the delayed clock signal, the delayed clock signal being delayed by an amount correlative to the magnitude of the bias delay signal.

3. The device, as set forth in claim 1, wherein the clock signal comprises a read clock signal.

4. The device, as set forth in claim 2, wherein the voltage control delay comprises:

a transistor pair being coupled together to form a first node, the transistor pair being coupled to receive a clock signal; and a transistor being coupled to receive the bias delay signal, the transistor being coupled to the first node, the delayed clock signal having a delay inversely proportional to the magnitude of the bias delay signal being generated at the first node.

5. A device comprising:

a processor; and a memory device coupled to the processor, the memory device comprising:
a memory array coupled to a data output path, the data output path having a data latch which stores data output by the memory array; and
a delay circuit coupled to the data latch, the delay circuit receiving a clock signal and a supply voltage signal, the delay circuit delaying the clock signal by an amount correlative to a magnitude of the supply voltage signal, and the delay circuit delivering a delayed clock signal to the data latch, wherein the delay circuit comprises a voltage-dependent bias source and a voltage control delay;

the voltage-dependent bias source being coupled to receive the supply voltage signal, the voltage-dependent bias source generating a bias delay signal having a magnitude correlative to the magnitude of the supply voltage signal, wherein the voltage-dependent bias source comprises:

a first resistor coupled to receive the supply voltage signal;

a first transistor coupled to the resistor at a first node, a voltage reference signal having a magnitude directly proportional to the magnitude of the supply voltage signal being generated at the first node;

a second transistor being coupled to the first node to receive the voltage reference signal;

a second resistor being coupled to the second transistor at a second node, a gain signal having a magnitude directly proportional to the voltage reference signal being generated at the second node; and a transistor pair being coupled together to form a third node, the transistor pair being coupled to the second node to receive the gain signal, a bias delay signal having a magnitude inversely proportional to the magnitude of the gain signal being generated at the third node; and the voltage control delay being coupled to receive the bias delay signal and the clock signal, the voltage control delay generating the delayed clock signal, the delayed clock signal being delayed by an amount correlative to the magnitude of the bias delay signal.

6. A memory device comprising:

a memory array for storing data;

a data latch coupled to the memory array by a data output path, the data latch storing data output on the data output path by the memory array; and a delay circuit receiving a clock signal and a supply voltage signal, the delay circuit increasingly delaying the clock signal in response to an increasing magnitude of the supply voltage signal, and the delay circuit delivering a delayed clock signal to the data latch.

7. The device, as set forth in claim 6, wherein the delay circuit comprises:

a voltage-dependent bias source being coupled to receive the supply voltage signal, the voltage-dependent bias source generating a bias delay signal having a magnitude correlative to the magnitude of the supply voltage signal; and a voltage control delay being coupled to receive the bias delay signal and the clock signal, the voltage control delay generating the delayed clock signal, the delayed clock signal being delayed by an amount correlative to the magnitude of the bias delay signal.

8. A memory device comprising:

a memory array for storing data;

a data latch coupled to the memory array by a data output path, the data latch storing data output on the data output path by the memory array; and a delay circuit receiving a clock signal and a supply voltage signal, the delay circuit increasingly delaying the clock signal in response to an increasing magnitude of the supply voltage signal, and the delay circuit delivering a delayed clock signal to the data latch, wherein the delay circuit comprises a voltage-dependent bias source and a voltage control delay;

the voltage-dependent bias source being coupled to receive the supply voltage signal, the voltage-dependent bias source generating a bias delay signal having a magnitude correlative to the magnitude of the supply voltage signal, wherein the voltage dependent bias source comprises:

a first resistor coupled to receive the supply voltage signal;

a first transistor coupled to the resistor at a first node, a voltage reference signal having a magnitude directly proportional to the magnitude of the supply voltage signal being generated at the first node;

a second transistor being coupled to the first node to receive the voltage reference signal;

a second resistor being coupled to the second transistor at a second node, a gain signal having a magnitude directly proportional to the voltage reference signal being generated at the second node; and a transistor pair being coupled together to form a third node, the transistor pair being coupled to the second node to receive the gain signal, a bias delay signal having a magnitude inversely proportional to the magnitude of the gain signal being generated at the third node; and the voltage control delay being coupled to receive the bias delay signal and the clock signal, the voltage control delay generating the delayed clock signal, the delayed clock signal being delayed by an amount correlative to the magnitude of the bias delay signal.

9. The device, as set forth in claim 7, wherein the voltage control delay comprises:

a transistor pair being coupled together to form a first node, the transistor pair being coupled to receive a clock signal; and a transistor being coupled to receive the bias delay signal, the transistor being coupled to the first node, the delayed clock signal having a delay inversely proportional to the magnitude of the bias delay signal being generated at the first node.

10. The device, as set forth in claim 6, wherein the clock signal comprises a read clock signal.

11. A delay circuit comprising:

means for generating a bias delay voltage correlative to a supply voltage; and means for receiving the bias delay voltage and an input signal and for delaying the input signal by an amount correlative to the bias delay voltage to generate an output signal which is delayed with respect to the input signal.

12. The circuit, as set forth in claim 11, wherein the generating means comprises:

a first resistor coupled to receive the supply voltage;

a first transistor coupled to the resistor at a first node, a voltage reference signal having a magnitude directly proportional to the magnitude of the supply voltage being generated at the first node;

a second transistor being coupled to the first node to receive the voltage reference signal;

a second resistor being coupled to the second transistor at a second node, a gain signal having a magnitude directly proportional to the voltage reference signal being generated at the second node; and a transistor pair being coupled together to form a third node, the transistor pair being coupled to the second node to receive the gain signal, the bias delay voltage having a magnitude inversely proportional to the magnitude of the gain signal being generated at the third node.

13. The circuit, as set forth in claim 11, wherein the receiving means comprises:

a transistor pair being coupled together to form a first node, the transistor pair being coupled to receive the input signal; and a transistor being coupled to receive the bias delay voltage, the transistor being coupled to the first node, the output signal having a delay inversely proportional to the magnitude of the bias delay voltage being generated at the first node.

14. The circuit, as set forth in claim 11, wherein the input signal comprises a clock signal and wherein the output signal comprises a delayed clock signal.

15. A delay circuit comprising:

a voltage-dependent bias source being coupled to receive a supply voltage, the voltage-dependent bias source generating a voltage signal having a magnitude correlative to the magnitude of the supply voltage and generating a bias delay signal having a magnitude correlative to the magnitude of the voltage signal; and a voltage control delay being coupled to receive the bias delay signal and a clock signal, the voltage control delay generating a delayed clock signal, the delayed clock signal being delayed by an amount correlative to the magnitude of the bias delay signal.

16. The circuit, as set forth in claim 15, wherein the voltage-dependent bias source comprises:

a first resistor coupled to receive the supply voltage;

a first transistor coupled to the resistor at a first node, the voltage reference signal having a magnitude directly proportional to the magnitude of the supply voltage signal being generated at the first node;

a second transistor being coupled to the first node to receive the voltage reference signal;

a second resistor being coupled to the second transistor at a second node, a gain signal having a magnitude directly proportional to the voltage reference signal being generated at the second node; and a first transistor pair being coupled together to form a third node, the transistor pair being coupled to the second node to receive the gain signal, the bias delay signal having a magnitude inversely proportional to the magnitude of the gain signal being generated at the third node.

17. The circuit, as set forth in claim 16, wherein the voltage control delay comprises:

a second transistor pair being coupled together to form a fourth node, the second transistor pair being coupled to receive a clock signal; and a third transistor being coupled to receive the bias delay signal, the third transistor being coupled to the fourth node, the delayed clock signal having a delay inversely proportional to the magnitude of the bias delay signal being generated at the fourth node.

18. The circuit, as set forth in claim 17, wherein the clock signal comprises a read clock signal.

19. A delay circuit comprising:

a first resistor coupled to receive a supply voltage;

a first transistor coupled to the resistor at a first node, a voltage reference signal having a magnitude correlative to the magnitude of the supply voltage being generated at the first node;

a second transistor being coupled to the first node to receive the voltage reference signal;

a second resistor being coupled to the second transistor at a second node, a gain signal having a magnitude correlative to the voltage reference signal being generated at the second node;

a first transistor pair being coupled together to form a third node, the first transistor pair being coupled to the second node to receive the gain signal, a bias delay signal having a magnitude correlative to the magnitude of the gain signal being generated at the third node;

a second transistor pair being coupled together to form a fourth node, the second transistor pair being coupled to receive a clock signal; and a third transistor being coupled to the third node to receive the bias delay signal, the third transistor being coupled to the fourth node, a delayed clock signal having a delay correlative to the magnitude of the bias delay signal being generated at the fourth node.

20. The circuit, as set forth in claim 19, wherein the clock signal comprises a read clock signal.

21. The circuit, as set forth in claim 19, wherein the magnitude of the voltage reference signal is directly proportional to the magnitude of the supply voltage.

22. The circuit, as set forth in claim 19, wherein the magnitude of the gain signal is directly proportional to the magnitude of the voltage reference signal.

23. The circuit, as set forth in claim 19, wherein the magnitude of the bias delay signal is inversely proportional to the magnitude of the gain signal.

24. The circuit, as set forth in claim 19, wherein the delay of the delayed clock signal is inversely proportional to the magnitude of the bias delay signal.

25. A memory device comprising:

means for transferring data from a memory array to a data latch which holds the data;

means for monitoring a supply voltage of the memory device;

means for producing a delay signal in response to the magnitude of the supply voltage rising above a threshold; and means for using the delay signal to cause the data latch to hold the data for a longer period of time.

26. A memory device comprising:

means for transferring data from a memory array to a data latch;

means for delivering a clock signal to the data latch;

means for monitoring a supply voltage of the memory device;

means for producing a voltage reference signal having a magnitude correlative to the magnitude of the supply voltage;

means for producing a gain signal having a magnitude correlative to the magnitude of the voltage reference signal;

means for producing a bias delay signal having a magnitude correlative to the magnitude of the gain signal; and means for using the bias delay signal to delay the clock signal delivered to the data latch to cause the data latch to hold the data for a longer period of time.

27. A method of delaying a clock signal comprising the acts of:

(a) generating a bias delay voltage correlative to a supply voltage; and (b) delaying the clock signal by an amount correlative to the bias delay voltage to generate a delayed clock signal which is delayed with respect to the clock signal.

28. The method, as set forth in claim 27, wherein act (a) comprises the acts of:

monitoring the supply voltage of the memory device;

producing a voltage reference signal having a magnitude correlative to the magnitude of the supply voltage;

producing a gain signal having a magnitude correlative to the magnitude of the voltage reference signal; and producing the bias delay voltage having a magnitude correlative to the magnitude of the gain signal.

29. The method, as set forth in claim 27, wherein act (b) comprises the acts of:

receiving the clock signal and the bias delay voltage; and delaying a switching rate of the clock signal by an amount correlative to the magnitude of the bias delay voltage to generate the delayed clock signal.

30. A method of operating a memory device comprising the acts of:

(a) transferring data from a memory array to a data latch which holds the data;

(b) monitoring a supply voltage of the memory device;

(c) producing a delay signal in response to the magnitude of the supply voltage rising above a threshold; and (d) using the delay signal to cause the data latch to hold the data for a longer period of time.

31. A method of operating a memory device comprising the acts of:

(a) transferring data from a memory array to a data latch;

(b) delivering a clock signal to the data latch;

(c) monitoring a supply voltage of the memory device;

(d) producing a voltage reference signal having a magnitude correlative to the magnitude of the supply voltage;

(e) producing a gain signal having a magnitude correlative to the magnitude of the voltage reference signal;

(f) producing a bias delay signal having a magnitude correlative to the magnitude of the gain signal; and (g) using the bias delay signal to delay the clock signal delivered to the data latch to cause the data latch to hold the data for a longer period of time.

* * * * *